(12) United States Patent
Liu et al.

(10) Patent No.: US 11,477,878 B2
(45) Date of Patent: Oct. 18, 2022

(54) PCB STRUCTURE AND METHOD AND APPARATUS FOR FORMING THE PCB STRUCTURE

(71) Applicant: Telefonaktiebolaget LM Ericsson (publ), Stockholm (SE)

(72) Inventors: Peng Liu, Beijing (CN); Tomas Bergsten, Rångedala (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/274,554

(22) PCT Filed: Sep. 14, 2018

(86) PCT No.: PCT/CN2018/105726
§ 371 (c)(1),
(2) Date: Mar. 9, 2021

(87) PCT Pub. No.: WO2020/051877
PCT Pub. Date: Mar. 19, 2020

(65) Prior Publication Data
US 2021/0274638 A1    Sep. 2, 2021

(51) Int. Cl.
*H05K 1/14* (2006.01)
*H05K 1/02* (2006.01)
*H05K 3/36* (2006.01)

(52) U.S. Cl.
CPC .......... *H05K 1/0207* (2013.01); *H05K 1/144* (2013.01); *H05K 3/368* (2013.01); *H05K 2201/042* (2013.01); *H05K 2201/10098* (2013.01); *H05K 2203/04* (2013.01)

(58) Field of Classification Search
CPC ...... H05K 1/0297; H05K 1/111; H05K 1/144; H05K 2201/10098; H05K 2203/04; H05K 3/368

See application file for complete search history.

(56) References Cited

U.S. PATENT DOCUMENTS

| | | | |
|---|---|---|---|
| 4,959,510 A | 9/1990 | Matsusaka et al. | |
| 6,410,857 B1* | 6/2002 | Gonya | H01R 12/52 439/74 |
| 8,472,197 B2* | 6/2013 | Higashibata | H01L 25/162 257/713 |
| 9,928,947 B1 | 3/2018 | Lee | |
| 2004/0218361 A1 | 11/2004 | Lin et al. | |
| 2009/0121326 A1* | 5/2009 | Kim | H05K 1/141 257/E23.169 |
| 2012/0081864 A1 | 4/2012 | Sakurai et al. | |
| 2014/0327126 A1* | 11/2014 | Narasimhan | H01L 23/3677 257/690 |

(Continued)

FOREIGN PATENT DOCUMENTS

CN      105263254 A      1/2016

*Primary Examiner* — Hoa C Nguyen
(74) *Attorney, Agent, or Firm* — Murphy, Bilak & Homiller, PLLC

(57) ABSTRACT

A PCB structure and a method and apparatus for forming the PCB structure are disclosed. The PCB structure further includes a metal plate configured between a first PCB and a second PCB by soldering. Therefore, the PCB structure is easy to be produced and the feasibility can be improved with a cheap solution.

8 Claims, 6 Drawing Sheets

(56) References Cited

U.S. PATENT DOCUMENTS

| | | | |
|---|---|---|---|
| 2015/0022978 A1* | 1/2015 | Steuer | H05K 9/0035 |
| | | | 361/803 |
| 2015/0049443 A1 | 2/2015 | Meyer-Berg | |
| 2018/0084637 A1 | 3/2018 | Ueda | |
| 2019/0098802 A1* | 3/2019 | Mokler | H05K 9/0081 |

* cited by examiner

PCB STRUCTURE AND METHOD AND APPARATUS FOR FORMING THE PCB STRUCTURE

TECHNICAL FIELD

Embodiments of the present disclosure generally relate to the field of electronic components of telecommunications, and more particularly, to a printed circuit board (PCB) structure and a method and apparatus for forming the PCB structure.

BACKGROUND

In general, at least one PCB need be used in an electronic device such as a network device or a terminal device. In a fifth generation (5G) radio unit, 64 or even 128 connections may be required between a radio PCB and an antenna PCB. In a current solution, those connections are realized by using some radio cables or connectors; in another solution, a complex PCB including a radio PCB and an antenna PCB is built.

This section introduces aspects that may facilitate a better understanding of the disclosure. Accordingly, the statements of this section are to be read in this light and are not to be understood as admissions about what is in the prior art or what is not in the prior art.

SUMMARY

The inventor has found that the solution of using the radio cables is very expensive and needs a long time to assemble those components; and the solution of using the connectors is easy to assemble but also expensive. The solution of building the complex PCB to integrate the radio PCB and the antenna PCB together is cheaper, but the complex PCB is not easy to be produced, so that feasibility needs to be improved.

Furthermore, in order to achieve good enough thermal performance, a metal plate is configured between the radio PCB and the antenna PCB. However, due to some manufacturing limitations, the metal plate in the complex PCB is small, such as a thickness of the metal plate is not greater than 0.5 mm and a size of the metal plate is not larger than the size of the radio PCB or the antenna PCB; such that thermal dissipation (or heat dissipation) performance of the complex PCB needs to be improved.

To solve at least part of the above problems, a PCB structure and a method and apparatus for forming the PCB structure are provided in the present disclosure. For example, the PCB structure may be configured in a network device or a terminal device. It may be appreciated that embodiments of the present disclosure are not limited to a network device or a terminal device, but could be more widely applied to any application scenario where similar problems exist.

Other features and advantages of embodiments of the present disclosure will also be understood from the following description of specific embodiments when read in conjunction with the accompanying drawings, which illustrate, by way of example, the principles of embodiments of the present disclosure.

In general, embodiments of the present disclosure provide a solution of a PCB structure, a method and apparatus for forming the PCB structure and a device to overcome the one or more problems pointed out in the above description.

In a first aspect, a PCB structure at least including a first PCB and a second PCB is provided. The PCB structure further includes a metal plate configured between the first PCB and the second PCB by soldering.

In one embodiment, the PCB structure further includes an interconnect PCB configured in the metal plate and to realize a signal connection between the first PCB and the second PCB.

In one embodiment, a first surface of the metal plate is connected to the first PCB via at least one first raised soldering pad; and a second surface of the metal plate is connected to the second PCB via at least one second raised soldering pad.

In one embodiment, the first PCB is a radio PCB and the second PCB is an antenna PCB; the metal plate is a copper plate and is used to perform thermal dissipation.

In one embodiment, a through hole is formed in the middle of the metal plate and the interconnect PCB is located in the through hole.

In one embodiment, a first surface of the interconnect PCB is connected to the first PCB via a plurality of third raised soldering pads; and a second surface of the interconnect PCB is connected to the second PCB via a plurality of fourth raised soldering pads.

In one embodiment, a thickness of the interconnect PCB is equal to or similar to the thickness of the metal plate.

In one embodiment, the first PCB and the second PCB are connected by least one raised soldering pad.

In one embodiment, a thickness of the metal plate is equal to or greater than 0.2 mm.

In one embodiment, a size of the metal plate is equal to or greater than the size of the first PCB or the second PCB.

In one embodiment, the metal plate comprises a wing structure which is beyond a lateral side of the first PCB or the second PCB.

In a second aspect, a method for forming a PCB structure is provided. The method includes: applying solder paste on a first PCB, a metal plate and a second PCB; and soldering the first PCB, the metal plate and the second PCB.

In one embodiment, the method further includes: applying solder paste on an interconnect PCB; and soldering the first PCB, the metal plate, the interconnect PCB and the second PCB; wherein the interconnect PCB is configured in the metal plate.

In one embodiment, the method further includes: placing the second PCB on a fixture; placing the metal plate on the second PCB; placing the interconnect PCB into the metal plate; and placing the first PCB on the metal plate.

In a third aspect, an apparatus for forming a PCB structure is provided, the apparatus includes a processor and a memory, wherein the memory containing instructions executable by the processor whereby the apparatus is operative to perform a method according to the second aspect.

In a fourth aspect, a device is provided. The device includes the PCB structure as illustrated in the first aspect.

In one embodiment, the device is a terminal device or a network device in a wireless communication system.

In a fifth aspect, a computer program product is provided. The product is tangibly stored on a computer readable storage medium and includes instructions which, when executed on a processor of an apparatus, cause the apparatus to perform a method according to the second aspect.

According to various embodiments of the present disclosure, a PCB structure at least including a first PCB and a second PCB is provided; the PCB structure further includes: a metal plate configured between the first PCB and the second PCB by soldering. Therefore, the PCB structure is easy to produce and the feasibility can be improved with a cheap solution.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
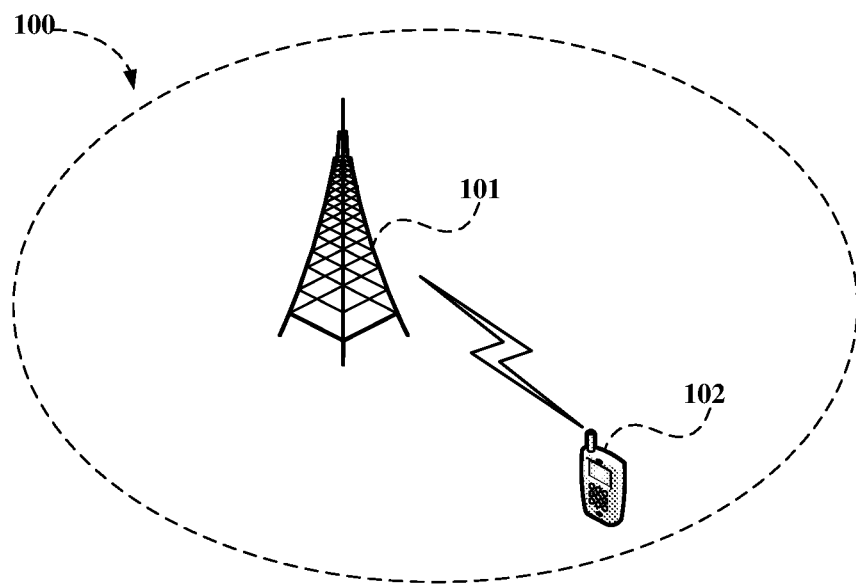
FIG. 1 is a schematic diagram of a wireless communication network.

The present disclosure will now be described with reference to several example embodiments. It should be understood that these embodiments are discussed only for the purpose of enabling those skilled persons in the art to better understand and thus implement the present disclosure, rather than suggesting any limitations on the scope of the present disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, the first generation (1G), the second generation (2G), 2.5G, 2.75G, the third generation (3G), the fourth generation (4G), 4.5G, the future fifth generation (5G) communication protocols, and/or any other protocols either currently known or to be developed in the future.

The term "network device" refers to a device in a wireless communication network via which a terminal device accesses the network and receives services therefrom. The network device refers a base station (BS), an access point (AP), a server, a controller or any other suitable device in the wireless communication network. The BS may be, for example, a node B (NodeB or NB), an evolved NodeB (eNodeB or eNB), a gNode B (gNB), a relay, a low power node such as a femto, a pico, and so forth.

The term "terminal device" refers to any end device that can access a wireless communication network and receive services therefrom. By way of example and not limitation, the terminal device refers to a mobile terminal, a user equipment (UE), or other suitable devices. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, mobile phones, cellular phones, smart phones, tablets, wearable devices, personal digital assistants (PDA), vehicles, and the like.

As used herein, the terms "first" and "second" refer to different elements. The singular forms "a" and "an" are intended to include the plural forms as well, unless the context clearly indicates otherwise. The terms "comprises," "comprising," "has," "having," "includes" and/or "including" as used herein, specify the presence of stated features, elements, and/or components and the like, but do not preclude the presence or addition of one or more other features, elements, components and/or combinations thereof. The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below.

Now some exemplary embodiments of the present disclosure will be described below with reference to the figures.

FIG. 1 shows a schematic diagram of a wireless communication network 100 in which embodiments of the disclosure may be implemented. As shown in FIG. 1, the wireless communication network 100 may include one or more network devices, for example network devices 101.

It will be appreciated that the network device 101 could also be in a form of gNB, Node B, eNB, BTS (Base Transceiver Station), BSS (Base Station Subsystem), access point (AP) and the like. The network device 101 may provide radio connectivity to a set of terminal devices or UEs 102-1, 102-2, . . . , 102-N (collectively referred to as "terminal device(s) 102) within its coverage, where N is a natural number.

It is to be understood that the configuration of FIG. 1 is described merely for the purpose of illustration, without suggesting any limitation as to the scope of the present disclosure. Those skilled in the art would appreciate that the wireless communication network 100 may include any suitable number of terminal devices and/or network devices and may have other suitable configurations.

A First Aspect of Embodiments

A PCB structure is provided in these embodiments. The PCB structure may be configured in a terminal device or a network device.

Figure 2:
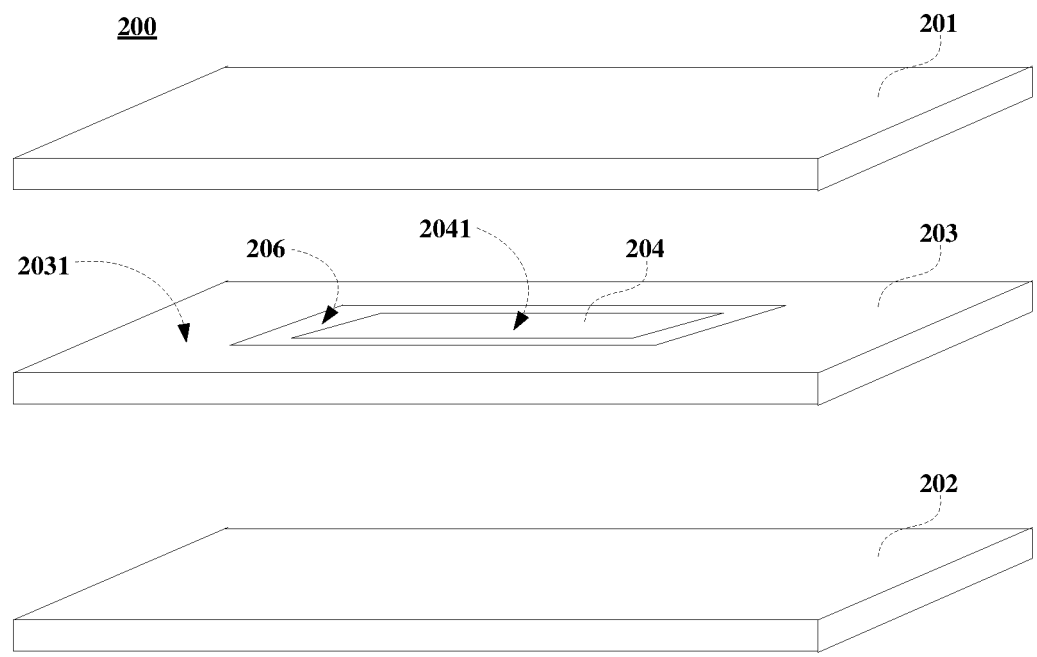
FIG. 2 is a schematic diagram which illustrates a PCB structure 200 before soldering in accordance with an embodiment of the present disclosure.
Figure 3:
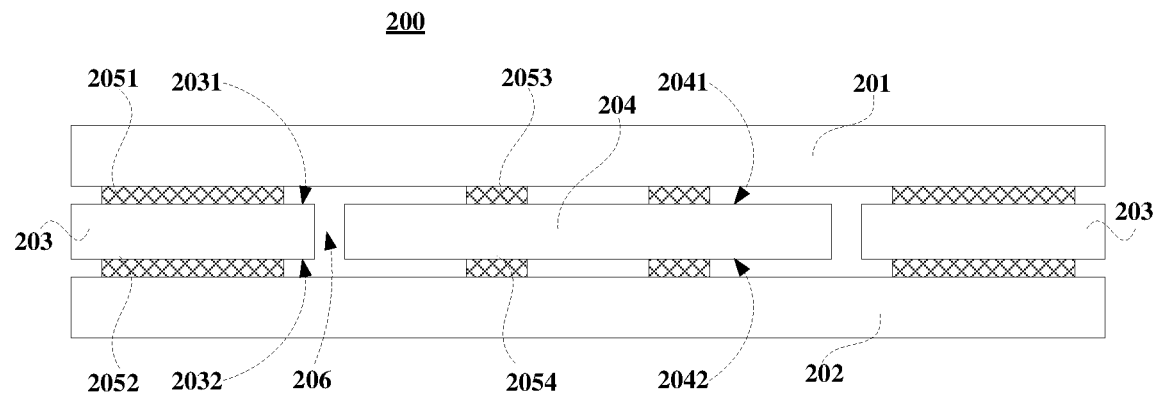
FIG. 3 is a cross-sectional schematic diagram which illustrates the PCB structure 200 after soldering in accordance with an embodiment of the present disclosure.

FIG. 2 is a schematic diagram which illustrates a PCB structure 200 before soldering in accordance with an embodiment of the present disclosure. FIG. 3 is a cross-sectional schematic diagram which illustrates the PCB structure 200 after soldering in accordance with an embodiment of the present disclosure.

As shown in FIGS. 2 and 3, the PCB structure 200 includes at least a first PCB 201 and a second PCB 202. The PCB structure 200 further includes: a metal plate 203 configured between the first PCB 201 and the second PCB 202 by soldering; and an interconnect PCB 204 configured in the metal plate 203 and to realize a signal connection between the first PCB 201 and the second PCB 202.

In this disclosure, different from the complex PCB, the first PCB 201, the second PCB 202, the metal plate 203 and the interconnect PCB 204 may be manufactured independently, then the first PCB 201, the second PCB 202, the metal plate 203 and the interconnect PCB 204 can be integrated into the PCB structure 200 by soldering. Therefore, the PCB structure is easy to be produced and the feasibility can be improved with a cheap solution.

In an embodiment, the first PCB 201 may be a radio PCB and the second PCB 202 may be an antenna PCB; the metal plate 203 may be a copper plate and is used to perform thermal dissipation. It is not limited thereto, for example, the first PCB 201 or the second PCB 202 may be another kind of PCB, and/or, the metal plate 203 may be an aluminum plate.

Figure 4:
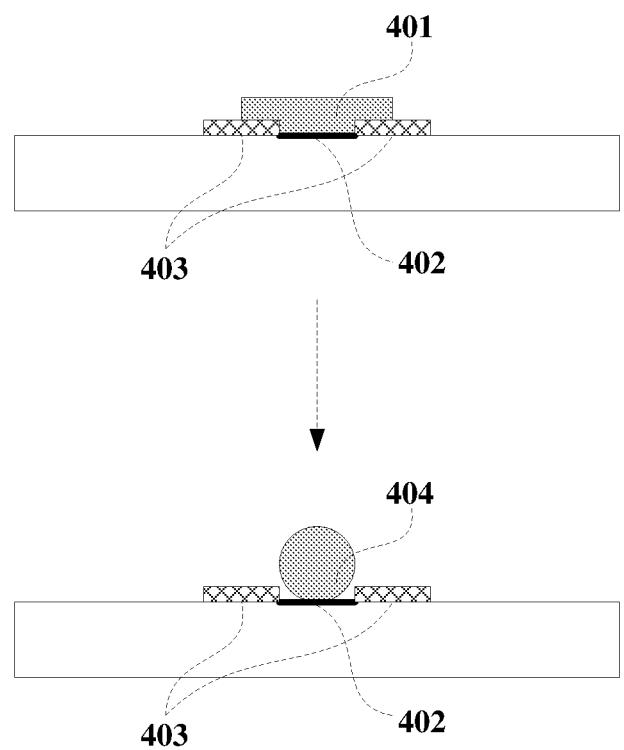
FIG. 4 is a schematic diagram which illustrates a raised soldering pad in accordance with an embodiment of the present disclosure.

In this disclosure, a plurality of raised soldering pads (such as an array) may be used in the soldering. FIG. 4 is a schematic diagram which illustrates a raised soldering pad in accordance with an embodiment of the present disclosure.

As shown in FIG. 4, for example, if some solder pastes 401 are applied on a pad 402 and a solder mask 403, the solder pastes 401 may become a solder ball 404 after soldering, such that the raised soldering pad is formed.

In an embodiment, as shown in FIGS. 2 and 3, a first surface 2031 of the metal plate 203 is connected to the first PCB 201 via at least one (or may be a plurality of) first raised soldering pad 2051; and a second surface 2032 of the metal plate 203 is connected to the second PCB 202 via at least one (or may be a plurality of) second raised soldering pad 2052. Therefore, the PCB structure is easy to be produced and the feasibility can be improved with a cheap solution.

In an embodiment, as shown in FIGS. 2 and 3, a through hole 206 is formed in the middle of the metal plate 203 and the interconnect PCB 204 is located in the through hole 206. Therefore, thermal dissipation (or heat dissipation) performance of the PCB structure can be improved.

In an embodiment, as shown in FIGS. 2 and 3, a first surface 2041 of the interconnect PCB 204 is connected to the first PCB 201 via a plurality of third raised soldering pads 2053; and a second surface 2042 of the interconnect PCB 204 is connected to the second PCB 202 via a plurality of fourth raised soldering pads 2054.

Therefore, radio performance can be further improved by using the interconnect PCB and the cost can be lowered by using the multi-layers PCB structure. Furthermore, it is easy to assemble the components during production by using the raised soldering pads.

In this disclosure, a thickness of the interconnect PCB 204 is equal to or similar to the thickness of the metal plate 203. By using the raised soldering pads, even though the thickness of the interconnect PCB 204 is not equal to the thickness of the metal plate 203, a distance between the first PCB 201 and the second PCB 202 can be adjusted and the components can be aligned, such that it is further easy to produce the PCB structure.

In an embodiment, a thickness of the metal plate may be equal to or greater than 0.2 mm. For example, the thickness may be 0.3 mm, 0.5 mm or 1.0 mm, or even 1.5 mm, and it is not limited thereto. Furthermore, a size of the metal plate may be equal to or greater than the size of the first PCB or the second PCB. Therefore, the metal plate in the PCB structure can be large and/or thick, such that thermal dissipation (or heat dissipation) performance of the PCB structure can be improved.

For example, the metal plate may include a wing structure which is beyond a lateral side of the first PCB or the second PCB. Therefore, thermal dissipation (or heat dissipation) performance of the PCB structure can be further improved.

Figure 5:
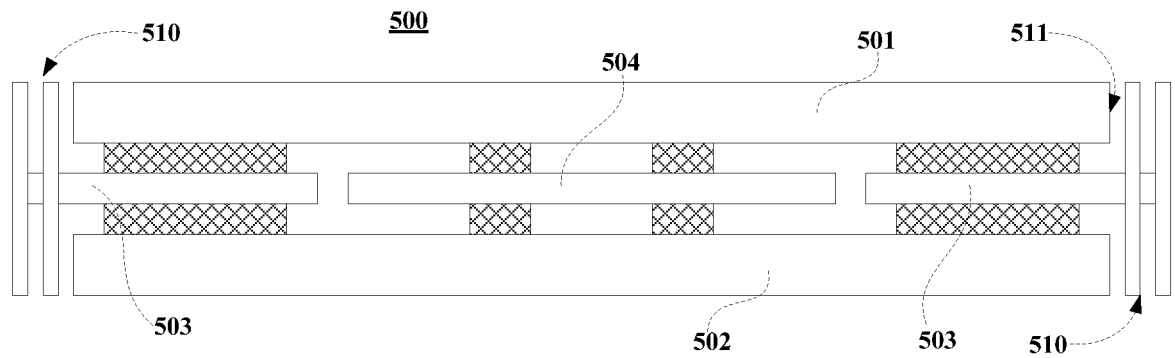
FIG. 5 is a cross-sectional schematic diagram which illustrates a PCB structure 500 after soldering in accordance with an embodiment of the present disclosure.

FIG. 5 is a cross-sectional schematic diagram which illustrates a PCB structure 500 after soldering in accordance with an embodiment of the present disclosure. As shown in FIG. 5, the PCB structure 500 includes at least a first PCB 501 and a second PCB 502. The PCB structure 500 further includes: a metal plate 503 configured between the first PCB 501 and the second PCB 502 by soldering; and an interconnect PCB 504 configured in the metal plate 503 and to realize a signal connection between the first PCB 501 and the second PCB 502.

As shown in FIG. 5, the metal plate 503 may include a wing structure 510 which is beyond a lateral side 511 of the first PCB 201 or the second PCB 202. It is not limited thereto, for example, the metal plate 503 may be other shapes. Therefore, thermal dissipation (or heat dissipation) performance of the PCB structure can be further improved via the wing structure 510.

Figure 6:
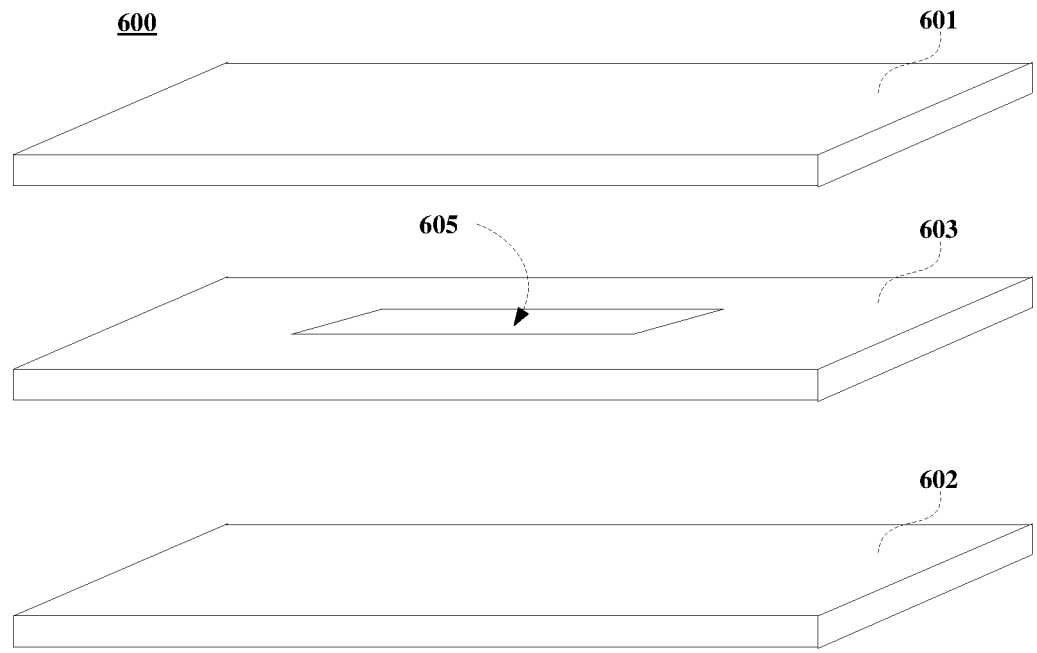
FIG. 6 is a schematic diagram which illustrates a PCB structure 600 before soldering in accordance with an embodiment of the present disclosure.
Figure 7:
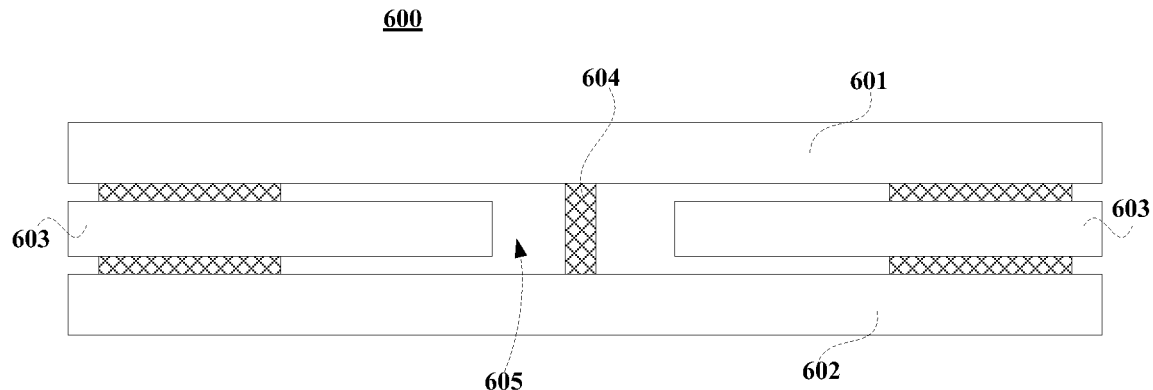
FIG. 7 is a cross-sectional schematic diagram which illustrates the PCB structure 600 after soldering in accordance with an embodiment of the present disclosure.

FIG. 6 is another schematic diagram which illustrates a PCB structure 600 before soldering in accordance with an embodiment of the present disclosure. FIG. 7 is a cross-sectional schematic diagram which illustrates the PCB structure 600 after soldering in accordance with an embodiment of the present disclosure.

As shown in FIGS. 6 and 7, the PCB structure 600 includes at least a first PCB 601 and a second PCB 602. The PCB structure 600 further includes: a metal plate 603 configured between the first PCB 601 and the second PCB 602 by soldering.

As shown in FIGS. 6 and 7, a through hole 605 is formed in the middle of the metal plate 603; the first PCB 601 and the second PCB 602 are connected by least one raised soldering pad 604 (may be a plurality of raised soldering pad) via the through hole 605. For example, the height of the raised soldering pad 604 may be equal to or less than 1 mm; and the thickness of the metal plate 603 may be maximum 1 mm.

Therefore, the PCB structure is easy to be produced and the feasibility can be improved. Furthermore, an interconnect PCB can be saved and this solution is cheaper than the solution shown in FIGS. 2 and 3.

It should be appreciated that FIGS. 1-7 is only examples of the disclosure, it is not limited thereto. For example, the links between blocks (or modules, components, and so on) may be adjusted and/or some blocks (or modules, components, and so on) may be omitted. Moreover, some blocks (or modules, components, and so on) not shown in FIGS. 1-7 may be added.

As can be seen from the above embodiments, a PCB structure at least including a first PCB and a second PCB is provided; the PCB structure further includes: a metal plate configured between the first PCB and the second PCB by soldering; and an interconnect PCB configured in the metal plate and to realize a signal connection between the first PCB and the second PCB. Therefore, the PCB structure is easy to produce and the feasibility can be improved with a cheap solution.

A Second Aspect of Embodiments

Based on the first aspect of embodiments, a method for forming the PCB structure is provided in the second aspect of embodiments.

Figure 8:
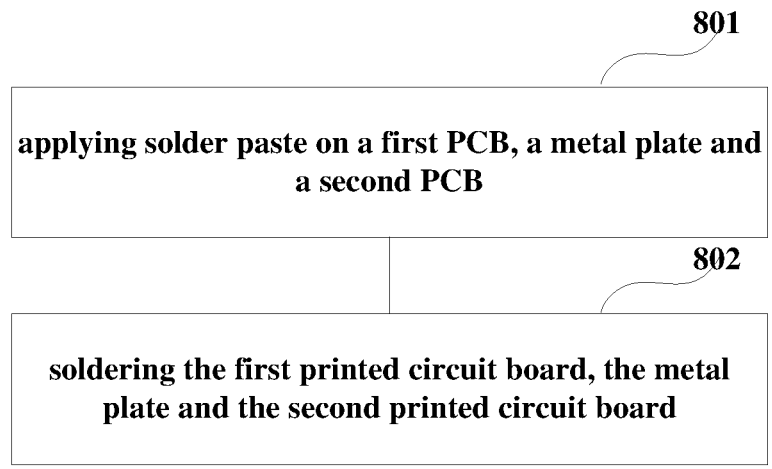
FIG. 8 is a schematic diagram which illustrates a method for forming the PCB structure in accordance with an embodiment of the present disclosure.

FIG. 8 is a schematic diagram which illustrates a method for forming the PCB structure in accordance with an embodiment of the present disclosure. As shown in FIG. 8, at block 801, applying solder pastes on a first PCB, a metal plate and a second PCB; and at block 802, soldering the first PCB, the metal plate and the second PCB.

In an embodiment, the method may further include: applying solder paste on an interconnect PCB; and soldering the first PCB, the metal plate, the interconnect PCB and the second PCB.

In an embodiment, the first printed circuit board and the second printed circuit board are connected by least one raised soldering pad.

In an embodiment, the metal plate is configured between the first PCB and the second PCB, the interconnect PCB is configured in the metal plate.

In an embodiment, the method may further include: placing the second PCB on a fixture; placing the metal plate on the second PCB; placing the interconnect PCB into the metal plate; and placing the first PCB on the metal plate.

In an embodiment, the first PCB may be a radio PCB and the second PCB may be an antenna PCB; the metal plate may be a copper plate and is used to perform thermal dissipation.

In an embodiment, a thickness of the metal plate is equal to or greater than 0.2 mm; and/or, a size of the metal plate is equal to or greater than the size of the first PCB or the second PCB.

Figure 9:
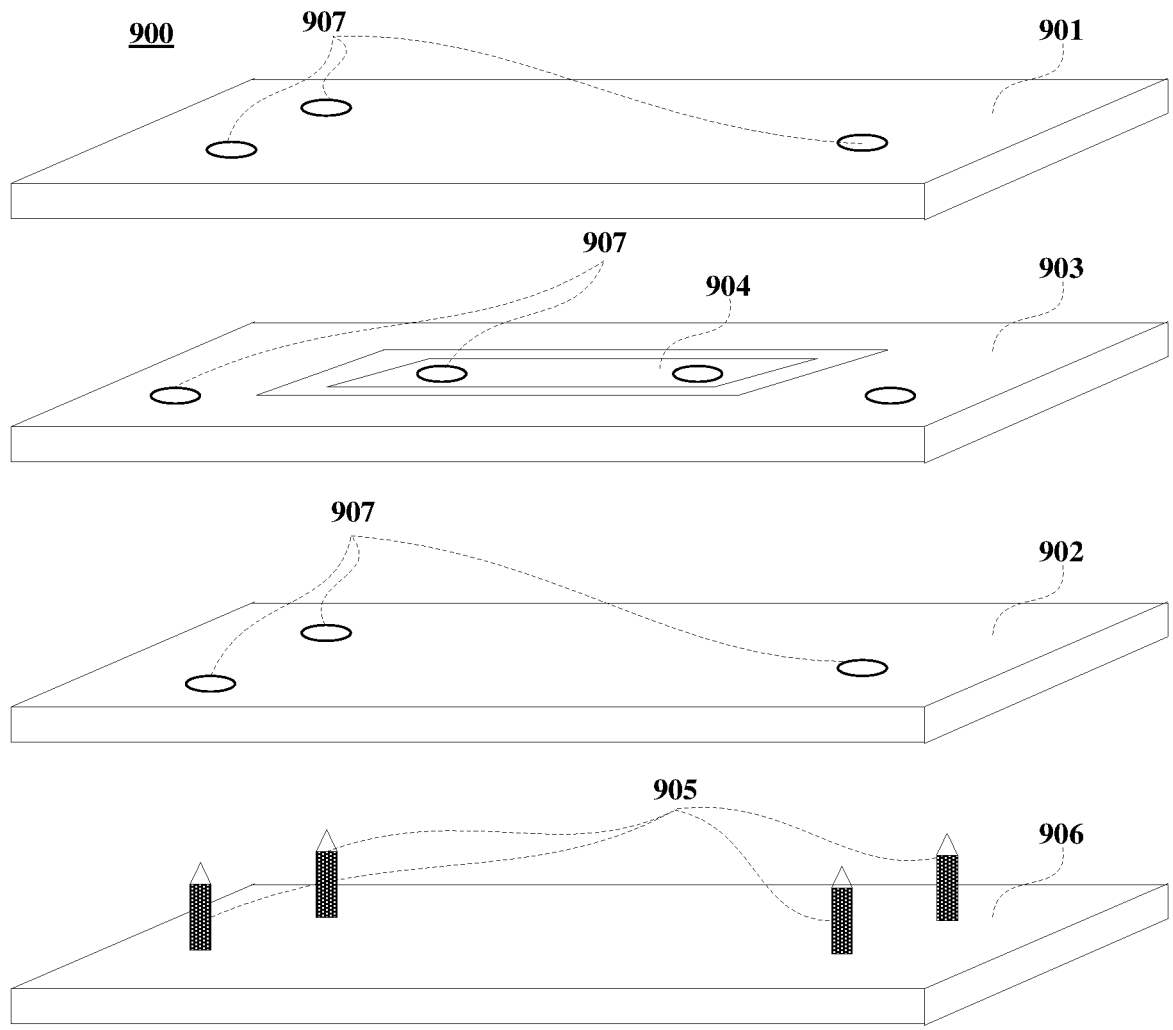
FIG. 9 is a schematic diagram which illustrates a sample of forming a PCB structure 900 in accordance with an embodiment of the present disclosure.

FIG. 9 is a schematic diagram which illustrates a sample of forming a PCB structure 900 in accordance with an embodiment of the present disclosure. As shown in FIG. 9, for example, firstly, solder pastes (not shown in the FIG. 9) are applied on a radio PCB 901, a metal plate 903, an interconnect PCB 904 and an antenna PCB 902.

Secondly, by using guiding pins 905 and guiding holes 907 (only a part of guiding pins 905 and guiding holes 907 are shown as examples in FIG. 9), the antenna PCB 902 is placed on a fixture 906; the metal plate 903 is placed on the antenna PCB 902; the interconnect PCB 904 is placed into the metal plate 903; and the first PCB 901 is placed on the metal plate 903.

Thirdly, the assembled PCB structure 900 is soldered. For example, a related soldering technique (such as SMT, Surface Mounted Technology) may be used.

As can be seen from the above embodiments, a PCB structure at least including a first PCB and a second PCB is provided; the PCB structure further includes: a metal plate configured between the first PCB and the second PCB by soldering; and an interconnect PCB configured in the metal plate and to realize a signal connection between the first PCB and the second PCB. Therefore, the PCB structure is easy to produce and the feasibility can be improved with a cheap solution.

A Third Aspect of Embodiments

An apparatus for forming a PCB structure is provided in the third aspect of embodiments.

Figure 10:
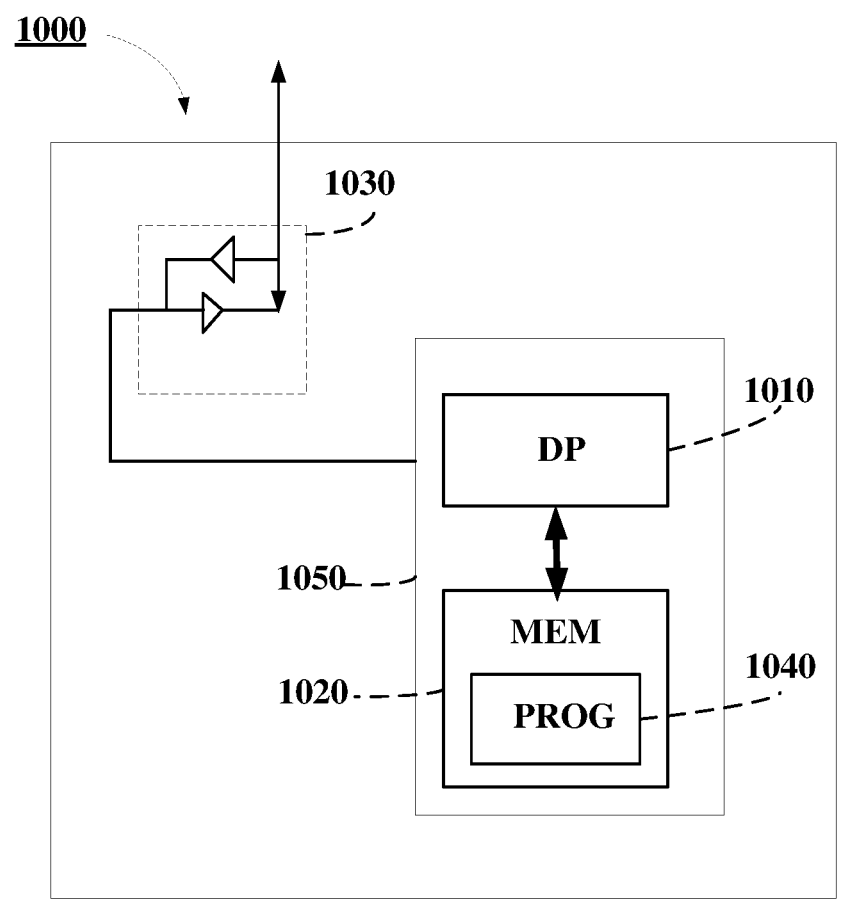
FIG. 10 shows a simplified block diagram of an apparatus for forming the PCB structure in accordance with an embodiment of the present disclosure.

FIG. 10 shows a simplified block diagram of an apparatus 1000 in accordance with an embodiment of the present disclosure. It would be appreciated that the apparatus 1000 may be implemented as at least a part of, for example, a programmable equipment.

As shown in FIG. 10, the apparatus 1000 includes: a communicating means 1030 and a processing means 1050. The processing means 1050 includes a data processor (DP) 1010, a memory (MEM) 1020 coupled to the DP 1010. The communicating means 1030 is coupled to the DP 1010 in the processing means 1050. The MEM 1020 stores a program (PROG) 1040. The communicating means 1030 is for communications with other devices, which may be implemented as a transceiver for transmitting/receiving signals.

The PROG 1040 is assumed to include program instructions that, when executed by the associated DP 1010, enable the apparatus 1000 to operate in accordance with the embodiments of the present disclosure. The embodiments herein may be implemented by computer software executable by the DP 1010 of the apparatus 1000, or by hardware, or by a combination of software and hardware. A combination of the data processor 1010 and MEM 1020 may form processing means 1050 adapted to implement various embodiments of the present disclosure.

The MEM 1020 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the apparatus 1000, there may be several physically distinct memory modules in the apparatus 1000. The DP 1010 may be of any type suitable to the local technical environment, and may include one or more of general purpose computers, special purpose computers, microprocessors, digital signal processors (DSPs) and processors based on multicore processor architecture, as non-limiting examples. The apparatus 1000 may have multiple processors, such as an application specific integrated circuit chip that is slaved in time to a clock which synchronizes the main processor.

For example, the MEM 1020 stores a plurality of instructions; and the DP 1010 is coupled to the MEM 1020 and configured to execute the instructions to perform a method according to the second aspect of the embodiments.

It will be appreciated that embodiments of the disclosure described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, radio transmitters, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or another computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general-purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine-readable medium may be a machine-readable signal medium or a machine-readable storage medium. The machine-readable medium may include but not limited to an electronic, magnetic, optical, electromagnetic, infrared, or semiconductor system, apparatus, or device, or any suitable combination of the foregoing.

More specific examples of the machine-readable storage medium would include an electrical connection having one or more wires, a portable computer diskette, a hard disk, a random-access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A printed circuit board (PCB) structure comprising:
   first and second PCBs in a stacked arrangement, the first PCB carrying radio circuitry and having a facing surface towards the second PCB, and the second PCB carrying an antenna for the radio circuitry and having a facing surface towards the first PCB;

a metal plate comprising a planar section disposed between the first and second PCBs for thermal dissipation, the metal plate being soldered on one side to one or more soldering pads on the facing surface of the first PCB and being soldered on the other side to one or more soldering pads on the facing surface of the second PCB, and having a central cutout; and a signal connection going between the first PCB and the second PCB and passing through the central cutout of the metal plate.

2. The PCB structure according to claim 1, wherein the metal plate is a copper plate.

3. The PCB structure according to claim 1, wherein a thickness of the metal plate is equal to or greater than 0.2 mm.

4. The PCB structure according to claim 1, wherein the metal plate extends beyond edges of the first and second PCB s into one or more integral wing structures running along respective edges of the first and second PCBs, the one or more integral wing structures providing additional mass and surface area for thermal dissipation.

5. The PCB structure according to claim 1, wherein all soldering pads used for soldering the metal plate to the respective facing surfaces of the first and second PCB s are raised soldering pads.

6. The PCB structure according to claim 1, wherein the signal connection comprises one or more soldered connections between the first and second PCBs formed via one or more raised soldering pads having a height sufficient to span the intervening gap between the first and second PCBs corresponding to the central cutout of the metal plate.

7. The PCB structure according to claim 1, wherein the signal connection comprises an interconnect PCB positioned in the central cutout of the metal plate, the interconnect PCB soldered on one side to one or more soldering pads on the facing surface of the first PCB and soldered on the other side to one or more soldering pads on the facing surface of the second PCB.

8. A communication device configured for use in a wireless communication system, the communication device comprising the PCB structure of claim 1.

* * * * *